US007000092B2

(12) United States Patent  (10) Patent No.: US 7,000,092 B2
Gehman et al.  (45) Date of Patent: Feb. 14, 2006

(54) HETEROGENEOUS MULTI-PROCESSOR REFERENCE DESIGN

(75) Inventors: Judy Gehman, Fort Collins, CO (US); Jeffrey Holm, Eden Prairie, MN (US); Steven Emerson, Chanhassen, MN (US)

(73) Assignee: LSI Logic Corporation, Milpitas, CA (US)

( * ) Notice: Subject to any disclaimer, the term of this patent is extended or adjusted under 35 U.S.C. 154(b) by 304 days.

(21) Appl. No.: 10/318,232

(22) Filed: Dec. 12, 2002

(65) Prior Publication Data

US 2004/0117743 A1  Jun. 17, 2004

(51) Int. Cl.
 *G06F 15/16* (2006.01)
 *G06F 13/40* (2006.01)

(52) U.S. Cl. .................................. 712/32; 712/225
(58) Field of Classification Search ................ 712/11, 712/13, 15, 227, 32, 225; 711/149; 717/128
See application file for complete search history.

(56) References Cited

U.S. PATENT DOCUMENTS 5,212,742 A * 5/1993 Normile et al. ............. 382/166
6,142,683 A * 11/2000 Madduri ..................... 717/128
6,173,425 B1 * 1/2001 Knaack et al. .............. 714/718
6,347,395 B1   2/2002 Payne et al.
2002/0091826 A1 * 7/2002 Comeau et al. ............. 709/226

* cited by examiner

*Primary Examiner*—Daniel H. Pan
(74) *Attorney, Agent, or Firm*—Suiter West Swantz PC LLO

(57) ABSTRACT

The present invention is directed to a system and method for heterogeneous multiprocessor reference design. In an aspect of the present invention, a method of designing a multiprocessor integrated circuit may include receiving a specification for an integrated circuit having multiprocessors, the specification having a desired functionality. Functional components are chosen which provide the desired functionality of the received specification. The functional components are implemented in a modular multiprocessor reference design as an example system for the multiprocessor integrated circuit. The implemented functional components of the modular multiprocessor reference design may be suitable for testing software for operation by the multiprocessor integrated circuit. Moreover, the modular multiprocessor reference design enables testing of interaction of functional components for providing the desired functionality of the received specification.

10 Claims, 4 Drawing Sheets

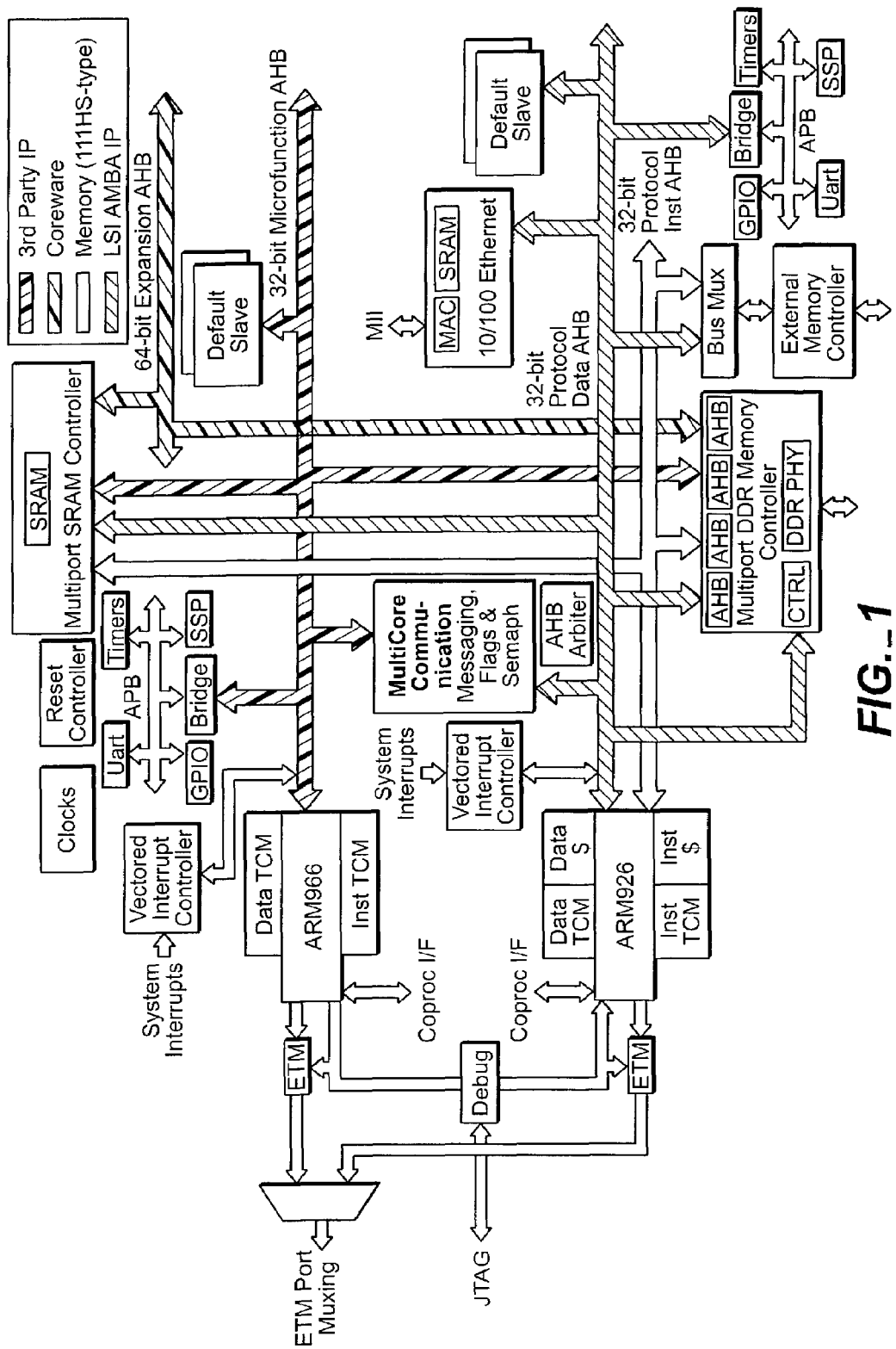
FIG._1

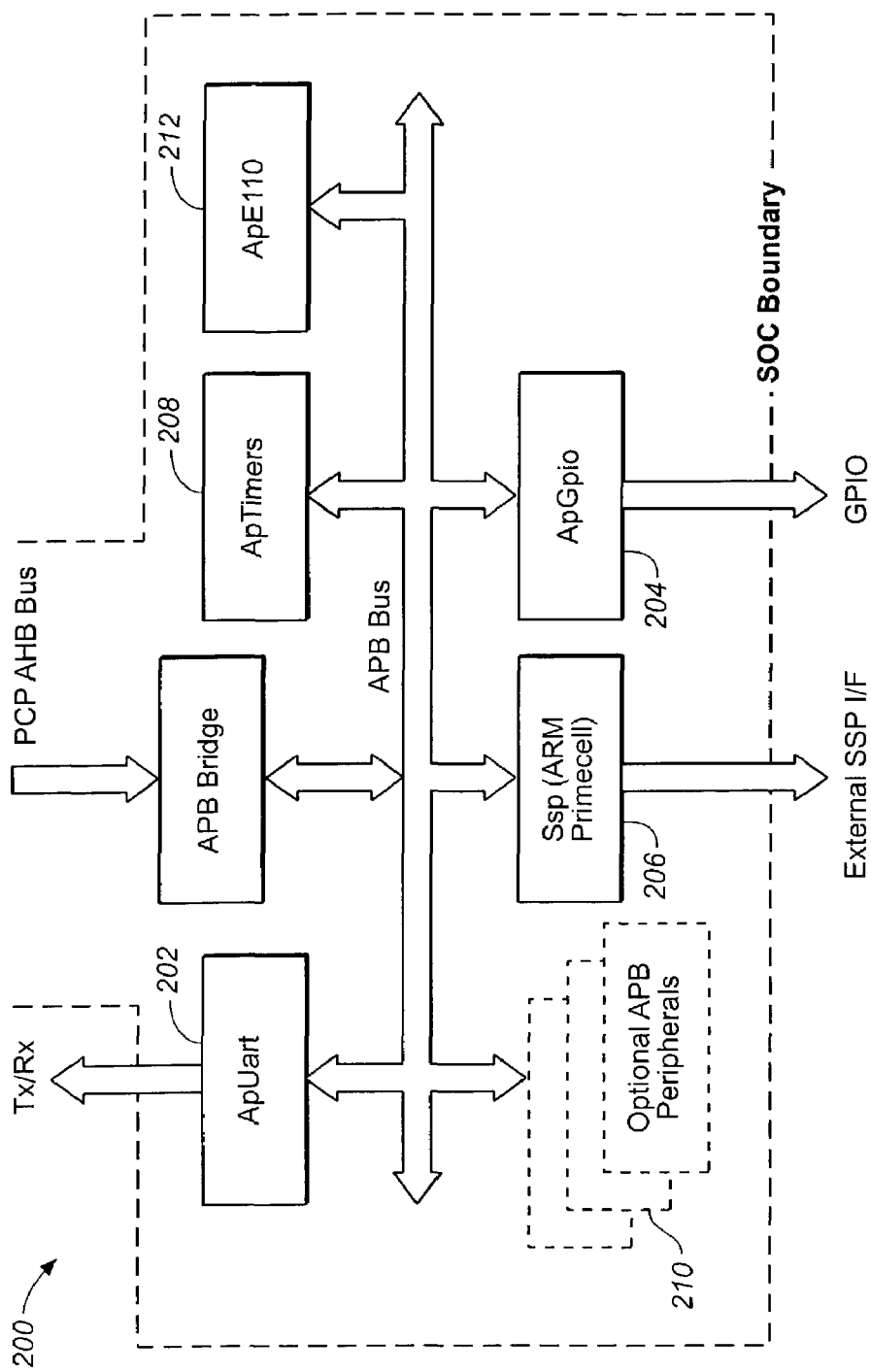
FIG._2

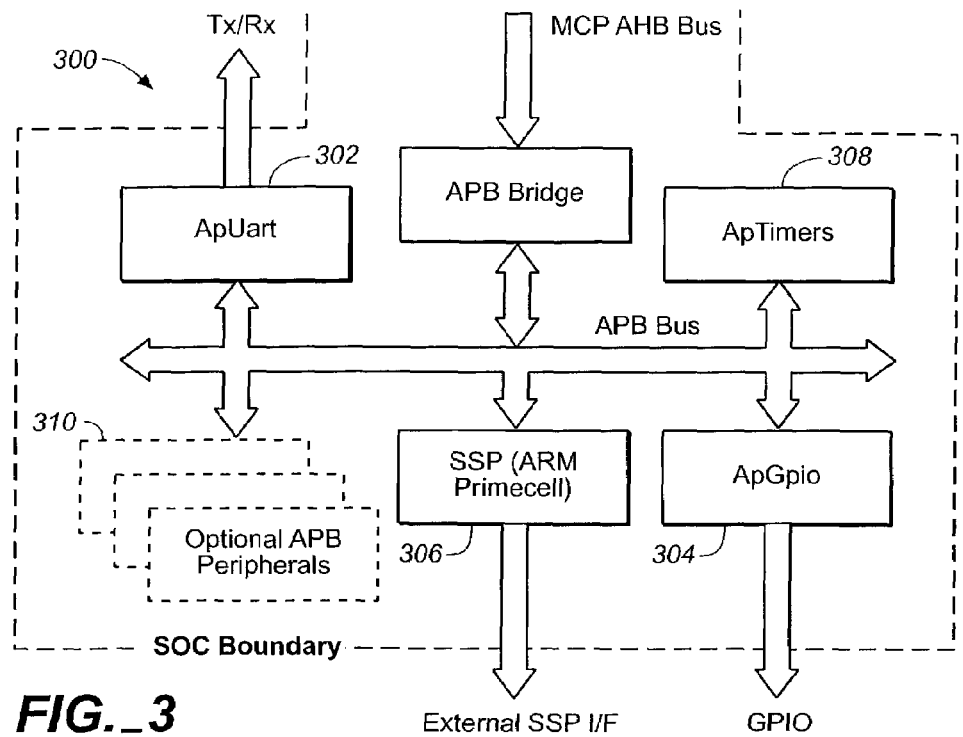
FIG._3
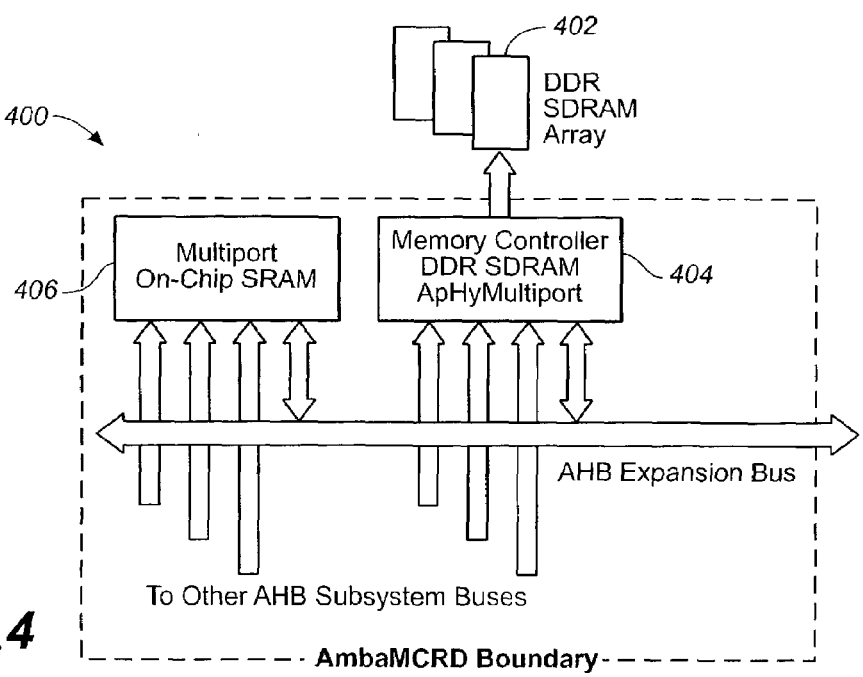
FIG._4

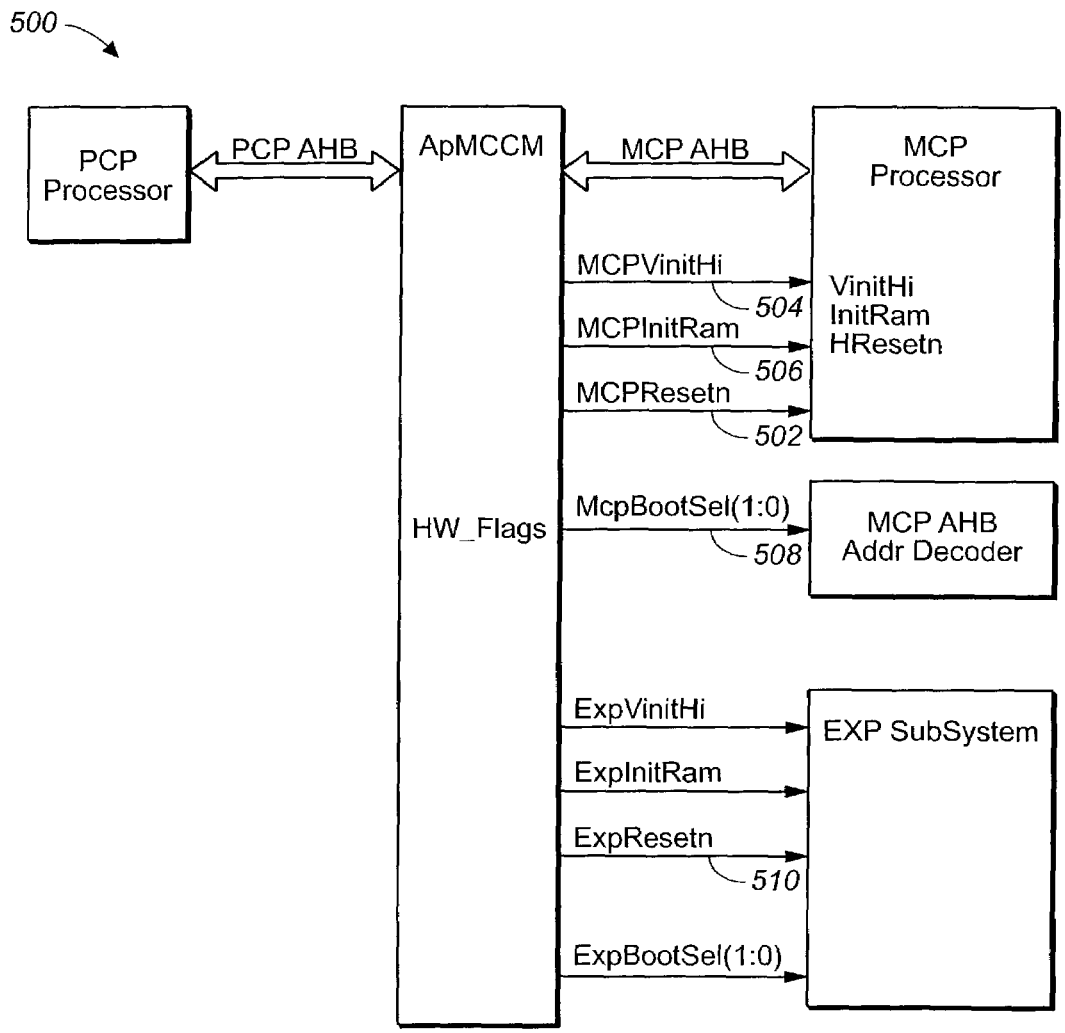
FIG._5

HETEROGENEOUS MULTI-PROCESSOR REFERENCE DESIGN

FIELD OF THE INVENTION

The present invention generally relates to the field of integrated circuit design, and particularly to a modular multiprocessor reference design suitable for use with varying numbers of heterogeneous processors.

BACKGROUND OF THE INVENTION

The design of integrated circuit is a time-consuming and complicated process. An integrated circuit may contain upwards of hundreds of functional components that need to be interconnected, arranged and verified in silicon to provide desired functionality. Added to this complexity is the further complication that technological advances in circuit design are increasing at a rapid pace. Therefore, the greater the time taken to design an integrated circuit, the longer it will take to get the product to market, due to the need to redesign the circuit to accommodate the technology. Therefore, increased efficiency in the design and manufacture of integrated circuits may result in a greater competitive advantage, improved time to market and improved access by consumers to the latest technology.

One method that was utilized to provide an integrated circuit design was to utilize a platform. However, previously, only single processor systems were employed, which did not provide the infrastructure needed for a multiple processor system.

Additionally, previous systems were designed for utilization with a single type of processor. Therefore, the implementation of a different processor involved the redesign of a system from the beginning, which was inefficient and expensive.

Therefore, it would be desirable to provide a heterogeneous multiprocessor reference design.

SUMMARY OF THE INVENTION

Accordingly, the present invention is directed to a system and method for heterogeneous multiprocessor reference design. In an aspect of the present invention, an apparatus for providing a reference design for an integrated circuit may include at least two processors, a multicore communication module (MCCM), a common memory controller and a bus interconnect. The MCCM provides a facility for the at least two processors to communicate with each other. The common memory controller is communicatively coupled to at least two processors, the common memory controller providing a shared memory resource to the at least two processors. The bus interconnect communicatively couples the at least two processors, MCCM, common memory controller and bus interconnect.

In an additional aspect of the present invention, an apparatus for designing an integrated circuit includes a protocol control processor (PCP) subsystem, a microfunction control processor (MCP) subsystem and an expansion subsystem. The protocol control processor (PCP) subsystem has a protocol control processor, wherein the protocol control processor serves as a communication protocol control processor and as a master processor in a master/slave relationship with other processors of the apparatus. The microfunction control processor (MCP) subsystem includes a microfunction control processor which performs low level hardware control of the apparatus. The subsystems are interconnected with multiport shared memory and multicore IP, the multicore IP providing the subsystems with the ability to communicate data and messages.

In a further aspect of the present invention, a method of designing a multiprocessor integrated circuit includes receiving a specification for an integrated circuit having multiprocessors, the specification having a desired functionality. Functional components are chosen which provide the desired functionality of the received specification. The functional components are implemented in a modular multiprocessor reference design as an example system for the multiprocessor integrated circuit. The implemented functional components of the modular multiprocessor reference design may be suitable for testing software for operation by the multiprocessor integrated circuit. The modular multiprocessor reference design enables testing of interaction of functional components for providing the desired functionality of the received specification. Moreover, this multicore reference design may be extended for additional processors and/or multicore IP.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by killed in the art by reference to the accompanying figures in which:

FIG. 1 is a block diagram of an exemplary embodiment of the present invention wherein a multicore reference design is shown;

FIG. 2 is a block diagram of an exemplary embodiment of the present invention wherein PCP APB subsystem is shown;

FIG. 3 is a block diagram of an exemplary embodiment of the present invention wherein an MCP APB subsystem is shown;

FIG. 4 is a block diagram of an exemplary embodiment of the present invention wherein an AHB expansion bus is shown; and FIG. 5 is a block diagram of an exemplary embodiment of the present invention wherein a system control function is shown.

DETAILED DESCRIPTION OF THE INVENTION

Reference will now be made in detail to the presently preferred embodiments of the invention, examples of which are illustrated in the accompanying drawings.

Referring generally now to FIGS. 1 through 5, exemplary embodiments of the present invention are shown. Previously, single processor systems were provided to build a simple design around a simple single processor system. However, the previous systems and methods did not provide the infrastructure needed for a multiple processor system.

Adding an additional processor to a reference design has a number of difficulties because such an addition is not as simple as "simply adding a processor." A variety of issues may be encountered, such as (1) it may be desirable to integrate multiple heterogeneous processors; (2) how do multiple processors boot from a common memory space without conflicts; (3) how will debugging of multiple processors be performed from a same JTAG port; (4) how to capture PC/Trace information across multiple cores and how to share external ports used to make PC/Trace information visible; (5) how to accommodate additional processor or subsystems which require different operating frequencies, endianess, or other data formats; and (6) how to make allowances for alternate boot methods and regions.

The present invention relates to a reference design for a multiprocessor system-on-chip (SOC) that may be composed of either same (homogenous) or different (heterogeneous) processor types integrated together with other subsystem components. Platforms are becoming an important methodology for SOC design in order to close the design gap between that which current RTL design based methodologies may produce and current CMOS process capacity. Furthermore, the present invention describes architectural features, design implementation styles, and methodologies, which are pertinent to a multiprocessor-based SOC platform. As a reference design, this is intended to be both flexible and extensible to the needs of most any multiprocessor-based SOC.

Existing solutions are targeted at a specific processor or multiprocessor system and none of the solutions in the industry provide a complete platform with the ability to easily add or remove processors or other components as needed.

A reference design of the present invention may be configured as an OS ready multi-core system with at least two embedded CPUs, which may be heterogeneous. The design may include multi-core IP such as a multicore communication module, on-chip shared memory, as well as a multiport DDR memory subsystem. Common system peripherals such as timers, external SRAM/Flash controllers, UARTs, vectored interrupt controllers and Ethernet MACs may be included as a set of peripherals, as these peripherals are often desired in the implementation of a real-time OS.

The reference design may include three separate AMBA subsystems which are interconnected with multiport shared memory and multicore IP, as shown in FIG. 1. The AMBA subsystems may include a protocol control processor (PCP) subsystem, a microfunction control processor (MCP) subsystem and an expansion subsystem. The multicore IP allows the subsystems to communicate both data and messages, as well as provide support for debugging. A more detailed description of an AHB bus design may be found in AMBA Specification published by ARM Limited (1999), Version 2.0, and particularly to Chapter 3 thereof (pp.3-1 to 3.58), which is herein incorporated by reference in its entirety.

Protocol Control Processor (PCP) Subsystem

The Protocol Control Processor (PCP) is the primary microcontroller in the Reference Design of the present invention. All other processors in the system are expected to be slaves to the PCP for startup and system control functions. The PCP controls MCP reset, configuration and boot sequencing using the hardware flags which are part of the MultiCore Communication Module (MCCM), which will be described subsequently. In addition, the PCP configures the Multiport DDR Memory Controller, the SRAM Flash controller, as well as the MCCM. The purpose of the PCP subsystem is to serve as the main communication protocol control processor for the system outside the SOC and as such may include a 10/100 Ethernet MAC. Additional communication IP such as USB, PCI or other may also be easily added to this system without departing from the spirit and scope thereof.

Although configured in a master/slave arrangement with other processors in the system as well as including other communication IP, the PCP may be used in other ways as contemplated by a person of ordinary skill in the art. Further, the PCP may be any of a variety of CPUs without departing from the spirit and scope of the present invention.

PCP Boot

The PCP is booted immediately after system reset is released. The PCP processor performs an initialization, writes the system control bits, and then releases reset to the other processors. Other processors in the system are held in reset state until the PCP has completed its initialization and releases reset on other processors in the system. The PCP then uses the system control bits which are driven by the MCCM hardware flags to sequence and control the rest of the system.

PCP Memory Subsystem

The PCP memory subsystem is hierarchal and may include a L1 cache and/or tightly-coupled-memory (TCM), L2 on-chip SRAM, and L3 off-chip SRAM/Flash or DDR DRAM. The processor subsystem may also include configurable data TCM and instruction TCM, as well as a vectored interrupt controller for low latency interrupt handling.

PCP AHB Subsystem

The PCP AHB subsystem functions as the main CPU system bus. Other peripherals attached to the AHB bus may include on-chip SRAM (which is multiported to allow access from other AHB buses), external SRAM/Flash controller for boot ROM, Flash, SRAM or other off-chip devices, 10/100 Ethernet MAC, Multicore Communication Module (MCCM) block, vectored interrupt controller, and the APB Bridge. Access to the external SRAM/Flash controller from either of the CPU (such as the ARM 926 shown in FIG. 1) instruction or data buses is provided by a bus multiplexer. The clock function (outside this subsystem) may be centralized within a single unit called the ClockGen and generates the AHB bus clock, processor clock and APB bus clock.

The infrastructure supports multimaster systems by adding an AHB Arbiter, master multiplexers, slave multiplexers and centralized address decoder. The AHB subsystem may be configured to change the system memory map and add other AMBA master or slave devices. Additional customer specifc AMBA IP can be easily added by replacing the dummy AHB slave devices.

PCP APB Subsystem

The PCP APB subsystem 200, as shown in an embodiment of the present invention depicted in FIG. 2, only functions as a slave bus. The APB devices included in the PCP APB subsystem may include: (1) 16550-compatible UART 202; (2) GPIO (x32) 204; (3) Synchronous Serial Port (SSP) 206; and (4) Timers (x2) 208.

The APB system is flexible enough to add up to 16 peripherals 210 to the APB which would otherwise slow down the AHB due to capacitive loading or additional multiplexing layers. The trade-off may include a slight increase in access latency by utilizing the APB bridge. The APB clock may be run at a submultiple of the AHB bus clock so there is an additional power savings in placing a peripheral onto the APB bus.

Ethernet-10/100

The PCP subsystem may include an Ethernet-10/100 Mbit media access controller (MAC) 212. The Ethernet controller may integrate the Ethernet MAC functionality along with an APB slave interface used to configure and control the MAC and an AHB Master interface with integrated DMA Controller (DMAC). This peripheral transfers between system memory and the MAC using the DMAC, and processes the data for input to an Ethernet-110 PHY. The processor may access registers and counters in the MAC and PHY for status and control through the AMBA Peripheral Bus (APB) Bridge and APB.

Receive/Transmit FIFOs

Separate receive and transmit memories may be implemented outside the Ethernet controller (ApE110) as bolt-on's to the AMBA IP. This implementation offers some flexibility to the user to change the size of the FIFOs. The external RAMs may be Dual port synchronous memory-type RAMs of depth 256, 512, 1024 or 2048 bytes and width of 9 bits. The ninth bit marks the last byte in a frame (EOF). The RAM implementation may be chosen based on technology, power, and speed constraints.

External Bus Interface Unit

The SRAM/Flash module contains the control logic for attaching external SRAM or Flash ROM and the required data path to interface them to the internal AHB. Supported features of SRAM/Flash controller block include: (1) de-multiplexed address/data bus; (2) byte addressable; (3) support for assembly/disassembly of references to/from the processor; (4) up to 8 chip selects with the following programmable features, programmable read wait state (1–16), programmable write wait state (1–16), programmable block offset address from that defined by the system, and decoder (64 Kbytes resolution). The External Bus Interface Unit may also be used to attach to a wide variety of external slaves.

Multiport Access for the Processor Instruction and Data Buses

Access to the external SRAM/Flash controller from either of the dual processor's instruction or data buses (such as the ARM926 processors shown in FIG. 1) is provided by the bus multiplexor. The bus multiplexor allows both instruction bus and data bus access into the external memory system.

On-Chip Memory (OCM)

AHB subsystem contains 32 Kbytes of multiport on-chip SRAM using the MCCM in the multiport SRAM configuration. Additional on-chip SPAM may be added as needed.

Vectored Interrupt Controller (VIC)

The AMBA IP Vectored Interrupt Controller (VIC) is the interrupt controller for the PCP subsystem. The controller is accessed over the AHB.

Microfunction Control Processor (MCP) Subsystem

The MCP performs the low level hardware control of the SOC. This low level control function is separated out from the protocol processing (PP) function to eliminate latency issues that might otherwise result if both functions were controlled by the same processor. The micro function routine will typically be much smaller in size than the PP subsystem but might typically share some common data area with the protocol processor. The additional port into the multiport memory subsystem will satisfy this purpose.

The system of the present invention is flexible enough that the MCP may include a wide variety of CPUs. The flexibility to integrate a variety of processors means the design may be configured to meet the functional and performance requirements of the end system, while providing a roadmap of different functional and performance points across the entire product family.

MCP AHB Subsystem

The MCP AHB subsystem functions as the main CPU system bus. Other peripherals attached to the AHB bus may include the internal multi-ported SRAM, DMAC, vectored interrupt controller, and the APB Bridge. The Clock function (outside this subsystem) may be centralized within a single unit called the ClockGen and generates the AHB bus clock, processor clock and APB bus clock. The choice of a centralized clock controller may be desirable in the development flow to properly control skew and for ease of test insertion. The infrastructure supports multimaster systems by adding an AHB Arbiter, master multiplexers, slave multiplexers and a centralized address decoder.

The AHB subsystem may be configured to change the system memory map to add other AMBA Master or Slave devices.

MCP APB Subsystem

The MCP APB subsystem 300, in an embodiment of the present invention in FIG. 3, functions as a slave bus. The APB devices included in the MCP APB subsystem may include: (1) 16550-compatible UART 302; (2) GPIO (x32) 304; (3) Synchronous Serial Port (SSP) 306; and (4) Timers (x2) 308.

The APB system in an embodiment of the present invention, as shown in FIG. 3, is flexible so as to enable the addition of up to 16 peripherals 310 to the APB which would otherwise slow down the AHB due to capacitive loading and/or additional multiplexing layers. The trade-off is a slight increase in access latency encountered through use of the APB bridge. The APB clock is typically run at a sub-multiple of the AHB bus clock so there is an additional power saving in placing a peripheral onto the APB bus.

Multiported On-Chip Memory (OCM)

The MultiCore reference design may have any amount of AHB attached multiported SRAM. Preferably, the current example utilizes 32 Kbytes of multiported memory.

Expansion Subsystem

The Expansion Subsystem 400, as shown in FIG. 4, may be modified to add customer IP, thereby increasing the flexibility of the Reference Design. The expansion subsystem may have a high speed data transfer bus and have access to common off-chip DDR SDRAM 402 through the Multiport DDR Memory Controller 404 as well as the on-chip multiported SRAM 406, and is also flexible for either big or little endian and bus frequency. This bus system may be implemented with any AHB bus width although the transfers into/out-of the on/off chip multiported memory systems will preferably be 64-bits. The expansion bus port in the current embodiment is setup to attach to an AHB master.

Reset and Clock Controller

A centralized clock and reset controller generates all core, bus, and peripheral clocks and resets.

System Control Function

A system control function 500, as shown in FIG. 5, is desirable in a multiprocessor system to help configure and control the overall power-up sequence as well as boot sequencing and mode. The MCCM hardware flags are used to control the following system functions: (1) MCP Reset 502; (2) MCP VinitHi {MCP processor boot hi/lo select}

504; (3) MCP InitRam {enable internal TCM memory} 506; (4) Boot Select {Control MCP AHB address map} 508; and (5) Expansion Bus Reset 510. These functions may be mapped to the MCCM Hardware flags.

This section shows how the PCP processor controls the resets of the other subsystems. The hardware flags of the MCCM are used. If more processors are added, additional flags may be used. The PCP processor boots, configures the systems, then releases the resets of the MCP and expansion bus subsystems.

This method allows components of the system to boot cleanly. The PCP subsystem reset is controlled in the clock/reset controller block.

Architecture

There are a number of architectural components in the MultiCore Reference Design that are well suited to multi-core applications, such as a multicore communication modules (MCCM), common memory controller, bus interconnect, bus segmentation, master-slave processors, address remapping, and the like.

MCCM (MultiCore Communication Module)

The MCCM is a flexible communication device especially suited to multiprocessor systems. The MCCM provides a facility for processors to communicate with each other. Since the favored method for communication varies between applications, the MCCM needs to be tailored to the application to allow any of: FIFO, random RD/WR, hardware flags, semaphores, and the like.

This device also contains a unique port specific ID register that allows each processor to self-discover where it resides within the system. This feature is useful to allow, for example, each of the processors to initialize from the same common boot image but using the unique ID, ascertain unique pieces of code that should be executed by each processor, and the like. This device may also be structured to allow a variable number of processors to interface with each other.

The Multicore Communication Module (MCCM) is a AMBA-based multiported memory which is used for communication, signaling (interrupts), and resource reservation and control (semaphores) between the ARM processors. The MCCM has the following features: (1) configurable memory size, single port memory which allows communication and event signaling between processors (2) to allows expansion beyond 2 processors, the MCCM may be multiported (configurable via compile-time option); (3) 32 or 64-bit AHB support; (4) FIFO or memory mapped interface; (5) adds support for semaphore operation without support for HLOCK (i.e. MIPS); (6) asynchronous interface allows AHB buses to be different frequencies; (7) Endianness selection (per port); (8) Includes signaling capability for managing mailbox access and interrupting ARM processors. Important features of the MCCM include that it is configurable and may be easily extended to support more than 2 processors. Also it handles the endianness and clock frequency differences between the ports.

Multiport Shared On-Chip SRAM

The multiport internal SRAM block is an on-chip shared multiported SRAM. This block allows both instruction and data to be shared as needed by software. The 4 AHB ports are connected to the PCP ARM926 Instruction AHB Bus, PCP ARM926 Data AHB Bus, the MCP ARM966 AHB Bus, and the AHB Expansion Bus.

PC/Data Trace Module Configuration

The supported configuration of PC/Data trace module for the Reference Design is for 2 ETM's instantiated supporting a shared ETM output port. The ARM PC and Data trace solution relies on the Embedded Trace Macrocell (ETM). The ETM contains a JTAG tap controller and so is daisy chained together with the processor(s) to allow a host resident debugger for configuration and control.

In an embodiment of the present invention, each processor has its own ETM (embedded trace module), but shares one ETM port to save pins. However, it should be realized that the ETMs may have individual ports without departing from the spirit and scope of the present invention.

Common Memory Controller

The memory controller provides a multiport high-speed interface to an external memory, like DDR. This shared memory is a requirement for many multiprocessor SOCs.

Bus Interconnect

The bus interconnect is expandable to allow any number of masters or slaves. As processors are added to the system, the interconnect easily scales to accommodate them. In addition, each of the buses connected to the AHB ports may have different characteristics including: (1) clocked at different frequencies, (2) different bus widths, (3) different endianess, and the like. Other reasons for the desirability for support of different clock frequencies are to allow system to only be run as fast as required for power savings or to shut down one clock entirely. It is also possible that due to the number of loads on a system bus, the bus frequency will have to be lowered to allow the system to run. This is important for multiprocessor systems where it may be difficult to run the entire system from a single clock source.

Bus Segmentation

The bus may be segmented to allow additional devices to be added to the different buses as needed. This allows the bandwidth and latency requirements to be balanced as needed by the application.

Master/Slave Processors

The MCCM is a centralized resource that contains hardware flags (discrete outputs) that may control the reset structure in other parts of the multiprocessor system. This provides a systematic method for resetting processors and/or controlling boot sequencing in a multiprocessor system. As additional processors are added, the reset logic scales accordingly.

Address Remapping

In order to allow flexibility in booting of multiple slave devices including the starting memory address, it is desirable to provide a systematic way for remapping the boot address regions for each slave subsystem. The address remapping logic was designed to be scaled to any number of processors and uses the MCCM hardware flags to implement this function.

Boot Strategy & Software Initialization

There are several different methods that may be used to boot the system. For instance, the PCP subsystem may first boot from the external SRAM/Flash memory controller while the MCP subsystem remains in reset. During initialization the PCP processor will configure both the external SRAM memory controller and multiport DDR SDRAM memory controller. After the PCP subsystem is booted, the PCP processor will assist the MCP subsystem in booting. To do this, the PCP processor has control over the MCP subsystem startup signals such as reset, internal ram enable, boot hi/low, and the boot method. The startup signals are controlled by the PCP subsystem by using the hardware flags in the MCCM (mailbox) peripheral. These signals are used by the MCP processor and MCP subsystem AHB decoder to boot the system. Therefore, through use of the present invention, a customer may choose where the boot code for the MCP processor is located and how to boot it without changing the hardware.

As an example of the configurability of the memory address mapping, the MCP address remapping mechanism, as controlled by the MCCM flags are shown in the table below. Each of the columns describes a separate boot method that is controlled by a signal coming out of the MCCM which goes into the MCP address decoder to remap addresses appropriately. The address map shows the location of several peripherals (MCCM, HyMultiPort_A DDR Memory Controller, and multiport internal SRAM) during these settings and also their locations during normal operation. All devices located in this address map were not included to simplify the table. Using the MCCM boot method, the PCP processor loads the MCCM with the bootstrap program for the MCP processor, followed by releasing reset, and allowing the MCP processor to boot from the MCCM. The MCP processor may load its program image to the multiport internal SRAM, its TCMs or external DDR as needed. At reset if flag boot hi/low is low, the MCCM is available at 0x0 or if flag boot hi/low is high, the MCCM is available at 0xFFFF.0000. During the MCP processor boot, the MCP processor may set its internal RAM enable high. This allows the TCM to become visible instead of the MCCM at the 0x0 location. The exception vectors may now be moved to the TCMs (if boot hi/low=0) to improve performance.

The DDR or multiport internal SRAM boot methods are similar to each other. After the PCP processor boots, it loads the external DDR or internal SRAM with the boot image for the MCP processor, followed by releasing the reset to the MCP processor and allowing the MCP processor to begin running. The MCP processor with boot hi/low=low, needs the external DDR or internal SRAM located at 0x0 when its reset is released. With boot hi/low equal to high, the MCP processor needs the external DDR or internal SRAM to be located at 0xFFFF.0000. The internal RAM enable may be set high as described above during the boot process. Although specific address locations have been described, it should be apparent to a person of ordinary skill in the art that a variety of address locations may be utilized without departing from the spirit and scope of the present invention.

It is believed that the heterogeneous multi-processor reference design of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. An apparatus for providing a reference design for an integrated circuit, comprising:
   at least two processors;
   a MultiCore Communication Module (MCCM), the MCCM providing a facility for the at least two processors to communicate with each other;
   a common memory controller communicatively coupled to the at least two processors, the common memory controller providing a shared memory resource to the at least two processors; and
   a bus interconnect communicatively coupling the at least two processors, MCCM, common memory controller and bus interconnect,
   wherein the MCCM has at least two of the following features:
   (a) a configurable memory size;
   (b) a memory to allow communication and event signaling between the at least two processors;
   (c) multiported to enable expansion beyond the at least two processors;
   (d) asynchronous interface so as to allow AHB buses to have different frequencies; and
   (e) endianess selection.

2. The apparatus as described in claim 1, wherein the bus interconnect supports at least one of (a) buses clocked at different frequencies; (b) different bus widths; and (c) different endianess.

3. The apparatus as described in claim 1, wherein the bus interconnect is segmented.

4. The apparatus as described in claim 1, wherein the MCCM includes discrete outputs to control reset structure

| Address | MCCM Method | DDR method | multiport internal SRAM method | TCM method |
|---|---|---|---|---|
| 0x0000.0000–0x0FFF.FFFF | BootSel = 2'b00 INITRAM = 1'b0 MCCM_msg (VINITHI = 1'b0) | BootSel = 2'b01 INITRAM = 1'b0 DDR (VINITHI = 1'b0) | BootSel = 2'b10 INITRAM = 1'b0 MCCM_sram (VINITHI = 1'b0) | BootSel = xx INITRAM = 1'b1 TCMs |
| 0x10000.0000–0x1FFF.FFFF | MCCM_sram | MCCM_sram | MCCM_sram | MCCM_sram |
| 0x20000.0000–0x2FFF.FFFF | | | | |
| 0x30000.0000–0x3FFF.FFFF | | | | |
| 0x40000.0000–0x4FFF.FFFF | | | | |
| 0x50000.0000–0x5FFF.FFFF | MCCM_msg | MCCM_msg | MCCM_msg | MCCM_msg |
| 0x60000.0000–0x6FFF.FFFF | | | | |
| 0x7000.0000–0x7FFF.FFFF | | | | |
| 0x80000.0000–0xEFFF.FFFF | DDR | DDR | DDR | DDR |
| 0xF000.0000–0xFFFE.FFFF | | | | |
| 0xFFFF.0000–0xFFFF.FFFF | MCCM-msg (VINITHI = 1'b1) | DDR (VINITHI = 1'b1) | MCCM_sram (VINITHI = 1'b1) | | thereby enabling resetting processors and control of boot sequencing the in the apparatus.

5. The apparatus as described in claim 1, further comprising a single JTAG port for debugging the apparatus.

6. The apparatus as described in claim 1, further comprising at least two PC/Data trace facilities.

7. The apparatus as described in claim 6, wherein the PC/Data trace facilities on-chip share a single external trace port.

8. The apparatus of claim 1, further comprising a protocol control processor (PCP) subsystem having a protocol control processor, wherein the protocol control processor serves as a communication protocol control processor and as a master processor in a master/slave relationship with other processors of the apparatus.

9. The apparatus of claim 1, further comprising a microfunction control processor (MCP) subsystem including a microfunction control processor which performs low level hardware control of the apparatus.

10. The apparatus of claim 1, further comprising an expansion subsystem.

\* \* \* \* \*